United States Patent [19]

Pellant et al.

[11] 4,188,996
[45] Feb. 19, 1980

[54] LIQUID COOLER FOR SEMICONDUCTOR POWER ELEMENTS

[75] Inventors: Michal Pellant; Jaroslav Zůna; Petr Novák; Zdeněk Zavázal; Jindřich Kratina; Pavel Reichel; Pavel Kafuněk, all of Prague, Czechoslovakia

[73] Assignee: CKD Praha, oborovy podnik, Prague, Czechoslovakia

[21] Appl. No.: 902,382

[22] Filed: May 3, 1978

[30] Foreign Application Priority Data

May 4, 1977 [CS] Czechoslovakia ............... 2035/77

[51] Int. Cl.² ..................... F28F 9/26; F28F 13/12
[52] U.S. Cl. ........................... 165/80C; 165/134 R; 165/170; 165/185; 357/82; 361/385
[58] Field of Search ............ 165/80 C, 80 E, 80 R, 165/185, DIG. 8, 168, 170, 133, 169, 134; 357/82; 174/15 R; 361/385

[56] References Cited

U.S. PATENT DOCUMENTS

| 1,610,651 | 12/1926 | Blaetz | 165/170 |
|---|---|---|---|
| 2,504,281 | 4/1950 | Spanne | 165/80 C |
| 2,864,731 | 12/1958 | Gurinsky | 165/133 |
| 2,917,286 | 12/1959 | Deakin | 165/133 |
| 2,979,644 | 4/1961 | Salzer | 165/80 C |
| 3,524,497 | 8/1970 | Chu et al. | 165/80 C |
| 3,823,771 | 7/1974 | Ludwig | 165/80 C |
| 4,012,770 | 3/1977 | Pravda et al. | 165/80 C |
| 4,029,141 | 6/1977 | Ferrari et al. | 165/80 C |
| 4,151,548 | 4/1979 | Klein et al. | 357/8 Z |

FOREIGN PATENT DOCUMENTS

| 600823 | 6/1960 | Canada | 165/80 B |
|---|---|---|---|
| 1026061 | 3/1958 | Fed. Rep. of Germany | 165/170 |
| 1914790 | 10/1970 | Fed. Rep. of Germany | 357/82 |
| 819022 | 10/1937 | France | 165/170 |
| 1109697 | 4/1968 | United Kingdom | 165/170 |
| 1306224 | 2/1973 | United Kingdom | 165/80 C |

Primary Examiner—Sheldon J. Richter

[57] ABSTRACT

There is disclosed a liquid cooler for semiconductor power elements, the cooler having an external surface for bearing against the cooled element. The internal space of the cooler is formed so as to generate a whirling motion of the cooling medium supplied thereto.

7 Claims, 4 Drawing Figures

LIQUID COOLER FOR SEMICONDUCTOR POWER ELEMENTS

BACKGROUND OF THE INVENTION

This invention has as its object the provision of a liquid cooler which is particularly suitable for the cooling of semiconductor power elements.

Up to now liquid coolers have been used rather seldom for the cooling of semiconductor power elements because cooling semiconductor power elements with relatively low power losses by air has been substantially simpler. However, with increasing heat losses of such semiconductor power elements, the dimensions of air coolers has increased so that now cooling arrangements employing air as the cooling medium are very much larger than arrangements employing a liquid as the cooling medium.

Designers of cooling arrangements for semiconductor power elements are now starting to use liquids as the cooling medium, since liquid cooling media have a much higher heat absorbing capacity than air, and in addition, meet with safety requirements as to shock and transient conditions because their heat inertia can absorb short heat impulses with only a small increase in temperature.

Liquid cooling also substantially reduces the noise level which inherently accompanies air cooled arrangements, since with liquid cooling it is possible to reduce or even completely to eliminate noise by disposing the heat exchanger and the necessary pumps outside the space in which the semiconductor power element is located. These advantages, however, are somewhat reduced by the complexity of cooling systems which employ liquid cooling media and the requirement for their maintenance, both of which result in increased operating costs. Despite such complications liquid cooling with forced circulation of the cooling medium holds out much promise for the cooling of semiconductor power elements.

Known liquid coolers are usually designed with straight liquid conducting channels, mainly because of their simple manufacturing technology. Such coolers are usually formed of material having good heat conductivity, such as for example copper. However, laminar layers are formed on the walls of such straight channels, thereby reducing the heat transfer from the body of the cooler to the cooling medium. There are also known arrangements of liquid coolers (U.S. Pat. No. 3,823,771) wherein a circular plate with radial grooves is fitted on at least one said thereof to a flat connecting piece provided with concentric circular grooves for the supply of cooling liquid. These arrangements are simple from the technological viewpoint; however, because of insufficient turbulence of the cooling liquid during its passage through the cooler they do not provide the required cooling effect for the space which is provided for the cooler in certain applications.

SUMMARY OF THE INVENTION

It is an object of the present invention to provide a liquid cooler for semiconductor power elements which to a high degree eliminates the creation of a laminar layer in the cooling space, is easy to manufacture, and can be adapted to use under different conditions.

In a preferred embodiment of liquid cooler in accordance with the invention, there is employed a relatively thick base plate of copper or the like having a plurality of spaced parallel channels open on a first broad surface thereof and closed in the second broad surface thereof. The parallel walls bounding the channels are divided into aligned studs spaced longitudinally of the channels. The studs have opposite parallel flanks which are parallel to the channels, whereas the two remaining opposite surfaces of the studs in each row thereof are formed as parts of cylindrical surfaces, the confronting surfaces of successive studs in each row being oppositely concave and mirror images of each other. The base is inserted into and secured and sealed to a round cup-shaped housing having a broad bottom (or top) which closes the open sides of the channels, and annular sidewall which closely surrounds the base plate. The ungrooved second surface of the base plate forms a bearing surface for the cooled semiconductor element. The cooling studs, the outer ends of which engage the inner surface of the broad bottom of the housing, stiffen the cooler and absorb a large part of the thrust exerted between the semiconductor power element and its clamping support.

The liquid cooler according to the invention provides a high turbulence of the flowing cooling liquid and thus a higher coefficient of heat transfer from the cooling medium to the material of the cooler. Due to the small space required by the cooler a good utilization of the material of the cooler is achieved, which is made, for example, of copper which is both expensive and increasingly difficult to obtain. Other advantages of the liquid cooler according to the invention are its high cooling effect, and the simple manufacturing technology required for its manufacture. Thus the cooler may be made by a number of conventional steps including boring, turning and cutting, and also dye casting. Thus the cooler can be made, if desired, by an automatic manufacturing process.

DESCRIPTION OF DRAWINGS

An examplary embodiment of a liquid cooler made in accordance with the invention is illustrated in the attached drawings, in which.

DESCRIPTION OF PREFERRED EMBODIMENT

Figure 1:
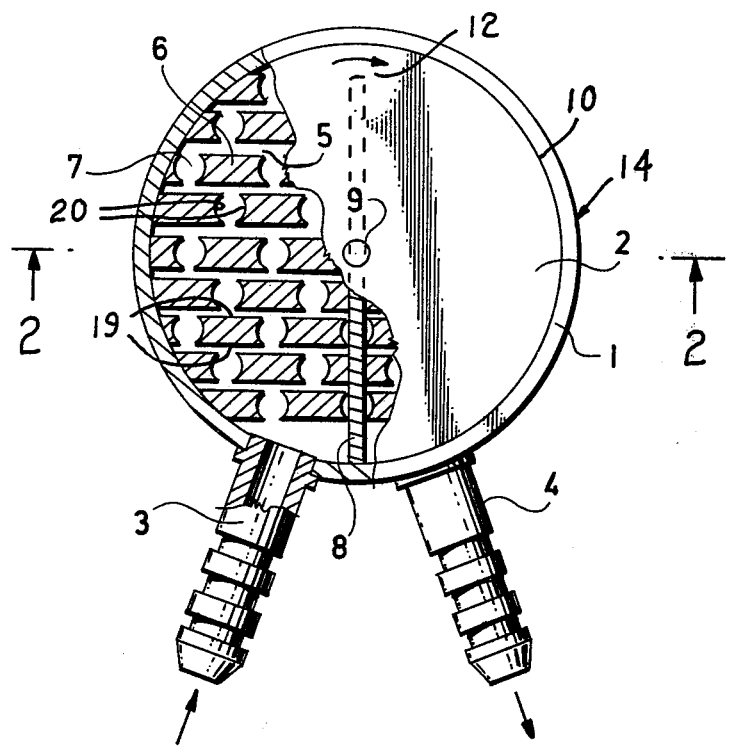
FIG. 1 is a view of the illustrative liquid cooler partially in plan and partially in horizontal section.

The liquid cooler 14 shown in the drawings comprises a main body 2 in the form of a thick cylindrical disc made, for example, of copper or the like, member 2 closely fitting within a round open-topped (FIG. 2) cup-shaped housing 1, which may also be made of copper or the like. The upstanding annular side walls of the housing closely embrace the outer edge of the body 2, the upper circumferential edge of the body 2 being secured and sealed to the upper inner edge of the side wall of the housing throughout their circumferences, as indicated at 10, as by soldering, welding, forming in the cold state, or by glueing. The lower broad surface of the body 2 is secured to the upper broad surface of the bottom portion of the housing by a layer of solder of suitable adhesive 11.

Figure 2:
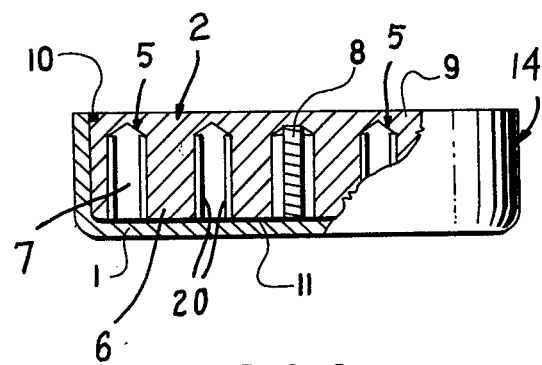
FIG. 2 is a view of the cooler of FIG. 1 partially in side elevation and partially in vertical section the section being taken along the line 2—2 of FIG. 1.

As shown in FIGS. 1 and 2 the body 2 is provided with a plurality of spaced parallel slots 5 which extend laterally across the body and from the bottom of the body (FIG. 2) upwardly to near the upper broad surface thereof. The upstanding portions of body 2 between slots 5 are divided into a plurality of upstanding studs 6 by a plurality of laterally spaced bores 7 having a diameter somewhat in excess of the thickness of the studs 6, the bores having their axes on the laterally extending center line of the studs. It will thus be seen that the studs have parallel opposite sides or flanks 19 and that the curved ends 20 of successive studs in a row are in the form of portions of a circular cylinder and are mirror images of each other.

The slots 5 and the bores 7 communicate with each other and form spaces for the reception of a cooling liquid. Cooling liquid is introduced into the cooler through an inlet fitting 3 and is exhausted therefrom through an outlet fitting 4. To insure the systematic flow of the cooling liquid through all of the slots 5 and bores 7 there is provided an upstanding diametrically disposed partition 8 which extends from and is sealed to the bottom of the housing 1 (FIG. 2) and the lower upstanding wall of the housing as shown in FIG. 1. The partition ends somewhat short of the upper portion of the upstanding side wall of the housing as shown in FIG. 1 to provide a passage 12 between the end of the partition and the upstanding side wall of the housing 1 at such location. Thus liquid flows into the cooler through the inlet fitting 3, fills and flows through all of the slots 5 and bores 7 therein to the left of the partition (FIG. 1), flows through the passage 12, fills and flows through the slots 5 and the bores 7 to the right of the partition, and outwardly through the outlet fitting 4.

The body 2 of the cooler is made of material of good heat conductivity, for example copper, aluminum or the like. The housing 1 can be made of metal; it can however also be made of some insulating material, for instance of plastic material. If the housing 1 and the base 2 are made of copper, as above described it is advantageous to connect them by a layer of solder 11, for example a silver solder containing 72% silver, remainder copper. The housing 1 and the base 2 can be made of aluminum or magnesium, or of their alloys, and in that case their surfaces are provided with a protective coating of the chromate type.

The length and width of cross section of the studs 6 is advantageously made to have the ratio of 2:1. The studs 6 in the body 2 may be made for example by a coordinate boring machine and by a subsequent cutting or milling, so that the cooling spaces 5, 7 are created between the studs 6, as above described. It is also possible to make the studs 6 by dye casting. The compact external surface of the body 2 is provided with a centering opening 9 for accurately locating the cooled semiconductive elements bearing on such surface.

In the embodiment of FIG. 2 the upper and lower surfaces of the semiconductor power element are flat and ungrooved.

Figure 4:
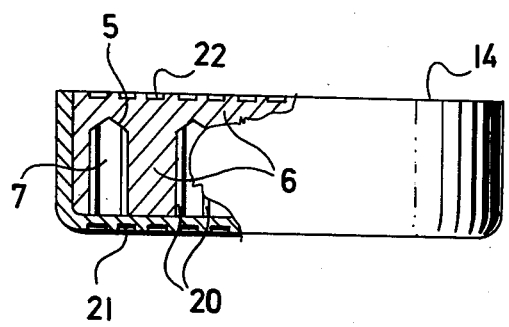
FIG. 4 is a view similar to FIG. 3 of a modified embodiment of the semiconductor power element of the invention.

In the embodiment of FIG. 4 wherein parts similar to those in FIG. 2 are designated by the same reference characters, the upper and the lower surfaces of the element are provided with spaces 22 and 21, respectively, for a metal which at operating temperatures of the cooled semiconductive element is in liquid condition. Such storage spaces may be made for example in the shape of grooves or scratches which allow the creation of a layer of such metal having a thickness between 0.01 to 2 mm. such metal consists for example of an alloy of bismuth, copper, lead, tin and cadmium with a melting point of 70° C., alloys which are generally suitable are those with 48 to 55% of bismuth, 18 to 40% lead, 2 to 15% tin, and 0 to 10% cadmium, such percentages being by weight. Alloys having no cadmium can comprise 10 to 21% of indium. These alloys are eutectic, have low melting point, and have a small change of volume in the course of transition from the solid to the liquid phase. It is also possible to use non-eutectic alloys of bismuth, lead, tin and cadmium, namely those which melt within a certain temperature range which is within the range of operating temperature of the cooled semiconductor element. These alloys can contain 35 to 51% bismuth, 27 to 37% of lead, 9 to 20% of tin, and 3 to 10% of cadmium, all percentages being by weight.

The cooling medium, for example water, enters the cooler by way of the inlet fitting 3 into the cooling space 5, 7 of the body 2 where it strikes the flanks 19 of the cooling studs 6, is whirled into vortices, such turbulent liquid then flowing around the partition wall 8 and through the passage 12, finally leaving the cooler by way of the outlet fitting 4. The highly turbulent flow of the cooling liquid, provided by the described shape of the cooling studs 6 and by their geometrical arrangement in the body 2 prevents the formation of any laminar layers of the liquid along the walls of the cooling space 5, 7 and produces an increase in the rate of heat transfer from the material of the cooler to the cooling liquid.

As will be seen in FIG. 1, the bores 7 between the studs 6 in successive rows of studs are staggered, so that the axes of the bores in each row thereof are disposed midway of the lengths of the studs in the next adjacent rows of studs. Further, each of the axes of the passages through the inlet and outlet fittings lies at a very substantial angle with respect to the lengths of the flanks 19 of the studs 6. These two factors cause a turbulent flow of liquid through the cooler, and insure the scouring of the surfaces of the studs 6 by the flowing liquid to prevent laminar flow of liquid along the surfaces thereof. Further, the oppositely curved surfaces 20 on the studs 6 cause a change in the speed of flow of the liquid as it first passes between the first opposite, more closely confronting edges of successive studs 6, into the relatively wider space 7, and out of such space 7 through the second opposite more closely confronting edges of successive studs 6. As the liquid leaves spaces 7, the curved surfaces 20 divert it to create two streams which are directed in opposite directions generally along the flanks 19 of the next adjacent studs. The flowing together of such two streams further adds to the turbulence of flow of cooling liquid through the cooler.

Figure 3:
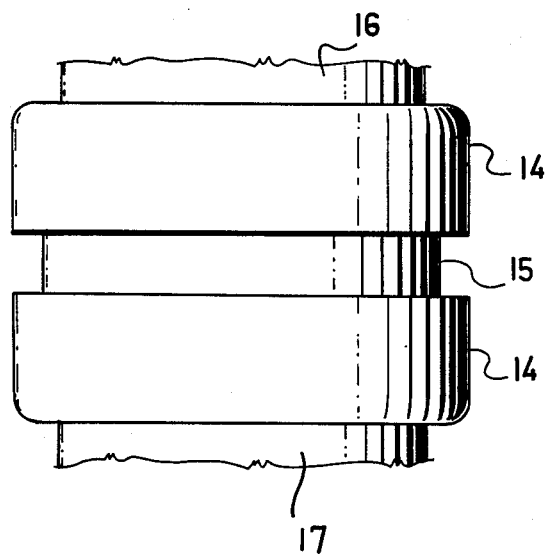
FIG. 3 is a schematic view in side elevation of an arrangement including a semiconductor power element clamped between two liquid coolers made in accordance with the embodiment of FIGS. 1 and 2.

In FIG. 3 there is schematically shown one possible application of the cooler of the invention. There a semiconductor power element 15 is shown clamped between two opposed liquid coolers 14 in accordance with the invention by means of an upper clamping member 16 and a lower clamping member 17 which are forcibly urged toward each other by means not shown. It is to be understood that in some instances only one cooler 14 is required, the semiconductor power element 14 then being clamped between one liquid cooler 14 and one of clamping elements 16, 17.

The liquid cooler in accordance with the invention, due to its substantially more perfect removal of heat losses from a member such as a semiconductor power element to be cooled, permits a substantial increase of the current load of the semiconductor element, and thus widens the range of possibilities of application of the semiconductor element. The cooler of the invention thus permits an increase in the power loads of semiconductor power elements and thus leads directly by its use to the achievement of substantial savings in electric power. The versatility of the electric cooler according to the invention particularly adapts it for use in the field of power electronics and in other applications wherein the transmission of large amounts of power gives rise to very substantial quantities of heat.

Although the invention is illustrated and described with reference to one preferred embodiment thereof, it is to be expressly understood that it is in no way limited to the disclosure of such a preferred embodiment, but is capable of numerous modifications within the scope of the appended claims.

What is claimed is:

1. A liquid cooler adapted for use with semiconductor power elements, comprising round cup-shaped case, having an annular side wall and a bottom, a cooler body inserted in the case, the side of the body facing the bottom of the case being formed as a number of extensions in the shape of studs creating a cooling space between them, a partition wall dividing the cooling space into an inlet space and an outlet space and providing communication there-between, and radially extending conduit means for supplying a cooling medium to the inlet space and exhausting the cooling medium from the outlet space, the ends of the studs facing the bottom of the case being connected to said bottom, the external surface of the body being essentially planar and forming a bearing surface for a cooled semiconductor element.

2. A liquid cooler as claimed in claim 1, wherein the cooler body is round, closely fits within the case, and is connected and sealed to the case around the circumference of the external surface of the body.

3. A liquid cooler as claimed in claim 1, wherein the studs are arranged in spaced relationship in spaced parallel rows, the flanks of the studs on the body are formed by two opposite parallel surfaces and the confronting end surfaces of the studs in each row are formed as oppositely concave surfaces which are parts of cylindrical surfaces.

4. A liquid cooler as claimed in claim 3, wherein the length and width of the cross section of said studs have substantially a 2 to 1 ratio.

5. A liquid cooler as claimed in claim 1, wherein the external surface of the body is provided with a centering recess.

6. A liquid cooler as claimed in claim 1, wherein at least one of the case and body forming the cooler is made of a light metal selected from the group consisting of aluminum, magnesium and their alloys, and is provided with a protective coating.

7. A liquid cooler as claimed in claim 1, wherein the external surface of the body is provided with spaces in the shape of grooves, and comprising a metal filling said grooves which is liquid at the operating temperatures of a semiconductive element in engagement with and cooled by the cooler.

* * * * *